(12) United States Patent
Jeon et al.

(10) Patent No.: US 8,222,798 B2
(45) Date of Patent: Jul. 17, 2012

(54) PIEZOELECTRIC RESONATOR AND ELECTRODE STRUCTURE THEREOF

(75) Inventors: Jong Beom Jeon, Gyunggi-do (KR); Katsushi Yasuda, Gyunggi-do (KR); Jong Pil Lee, Gyunggi-do (KR); Jang Ho Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/223,368

(22) Filed: Sep. 1, 2011

(65) Prior Publication Data

US 2011/0316392 A1 Dec. 29, 2011

Related U.S. Application Data

(63) Continuation-in-part of application No. 12/428,030, filed on Apr. 22, 2009, now Pat. No. 8,035,282.

(30) Foreign Application Priority Data

Sep. 26, 2008 (KR) .................. 10-2008-0094541
Apr. 14, 2011 (KR) .................. 10-2011-0034684

(51) Int. Cl.
*H01L 41/08* (2006.01)
(52) U.S. Cl. ......... 310/363; 310/366; 310/365; 310/358
(58) Field of Classification Search .......... 310/363–366, 310/358, 328; *H01L 41/08; H03H 9/13*
See application file for complete search history.

(56) References Cited

U.S. PATENT DOCUMENTS

| 6,278,602 B1* | 8/2001 | Haratani et al. | 361/303 |
| 7,071,599 B2* | 7/2006 | Namerikawa et al. | 310/366 |
| 2006/0207078 A1* | 9/2006 | Namerikawa et al. | 310/328 |

FOREIGN PATENT DOCUMENTS

| JP | 63-316912 | 12/1988 |
| JP | 2006-033181 | 2/2006 |
| KR | 10-2008-0046350 | 5/2008 |

OTHER PUBLICATIONS

Korean Intellectual Property Office, Office Action issued Dec. 22, 2009.

* cited by examiner

*Primary Examiner* — Thomas Dougherty
*Assistant Examiner* — Karen B Addison
(74) *Attorney, Agent, or Firm* — Lowe, Hauptman, Ham & Berner, LLP

(57) ABSTRACT

There are provided an electrode structure of a piezoelectric resonator and a piezoelectric resonator including the same. The piezoelectric resonator includes: a piezoelectric plate vibrated by an electrical signal; and first and second electrodes having first to fourth layers stacked on both surfaces thereof, wherein the first and third layers are made of at least one selected from the group consisting of Ti, Ni, Cr, an alloy including Ti and an alloy including Cr and the second and fourth layers are made of Ag or an alloy including Ag.

12 Claims, 4 Drawing Sheets

PIEZOELECTRIC RESONATOR AND ELECTRODE STRUCTURE THEREOF

CROSS-REFERENCE TO RELATED APPLICATIONS

This application claims the priority of Korean Patent Application No. 10-2008-0094541 filed on Sep. 26, 2008 and Korean Patent Application No. 10-2011-0034684 filed on Apr. 14, 2011, in the Korean Intellectual Property Office, the disclosure of which is incorporated herein by reference.

BACKGROUND OF THE INVENTION

1. Field of the Invention

The present invention relates to a piezoelectric resonator and an electrode structure thereof, and more particularly, to an electrode structure of a piezoelectric resonator having high reliability and low manufacturing costs, and a piezoelectric resonator including the same.

2. Description of the Related Art

A piezoelectric resonator generally has several uses such as a frequency oscillator, a frequency regulator, a frequency converter, or the like. Quartz having excellent piezoelectric characteristics is used as a piezoelectric material in a piezoelectric resonator. This quartz serves as a stable mechanical vibration generator.

In this case, quartz used as a piezoelectric material is artificially grown in a high pressure autoclave and is cut based on the axis of a crystal, and the size and shape thereof are processed so as to have desired characteristics, such that the quartz has a wafer shape. Here, the quartz is required to have a low phase noise, a high quality (Q) value, and a low frequency change rate for a change in time and environment.

Here, the Q value indicates band selection characteristics in a resonator, a filter, an oscillator, or the like, and is called a quality factor. In addition, the Q value may be determined to be a ratio of a central frequency to a 3 decibel (dB) bandwidth. The larger the Q value is, the better the frequency selection characteristics of the oscillator are.

As an electrode structure for a piezoelectric resonator according to the related art, a two-layer type of electrode has been used.

In the case in which a change in an external thermal environment, such as during a soldering process when a piezoelectric resonator is manufactured, is generated, an oscillating frequency of the piezoelectric resonator is varied. The varied frequency returns to an original frequency over time.

The frequency variation characteristics according to the change in thermal environment have caused an increase in product lead time and a limitation in using a product requiring frequency deviation accuracy of the piezoelectric resonator.

Therefore, various attempts have been made in order to improve the frequency variation characteristics of quartz.

SUMMARY OF THE INVENTION

An aspect of the present invention provides an electrode structure of a piezoelectric resonator having high reliability and low manufacturing costs by improving frequency variation characteristics according to a change in an external thermal environment, and a piezoelectric resonator including the same.

According to an aspect of the present invention, there is provided a piezoelectric resonator including: a piezoelectric plate vibrated by an electrical signal; and first and second electrodes having first to fourth layers stacked on both surfaces of the piezoelectric plate, wherein first and third layers are made of at least one selected from the group consisting of Ti, Ni, Cr, an alloy including Ti and an alloy including Cr, and second and fourth layers are made of Ag or an alloy including Ag.

A ratio of a thickness of the first electrode or the second electrode to a thickness of the piezoelectric plate may be 1% or less.

The first layer may have a thickness of 0.3 to 50 nm.
The second layer may have a thickness of 10 to 300 nm.
The third layer may have a thickness of 0.3 to 50 nm.
The fourth layer may have a thickness of 3 nm or more.

The first and second electrodes may have a structure in which the first to fourth layers are repeatedly stacked on the both surfaces of the piezoelectric plate.

According to another aspect of the present invention, there is provided an electrode structure of a piezoelectric resonator, the electrode structure including first to fourth layers stacked on a main surface of a piezoelectric plate, wherein first and third layers are made of at least one selected from the group consisting of Ti, Ni, Cr, an alloy including Ti and an alloy including Cr and second and fourth layers are made of Ag or an alloy including Ag.

A ratio of a thickness of an electrode to a thickness of the piezoelectric plate may be 1% or less.

The first to fourth layers may be repeatedly stacked on the main surface of the piezoelectric plate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
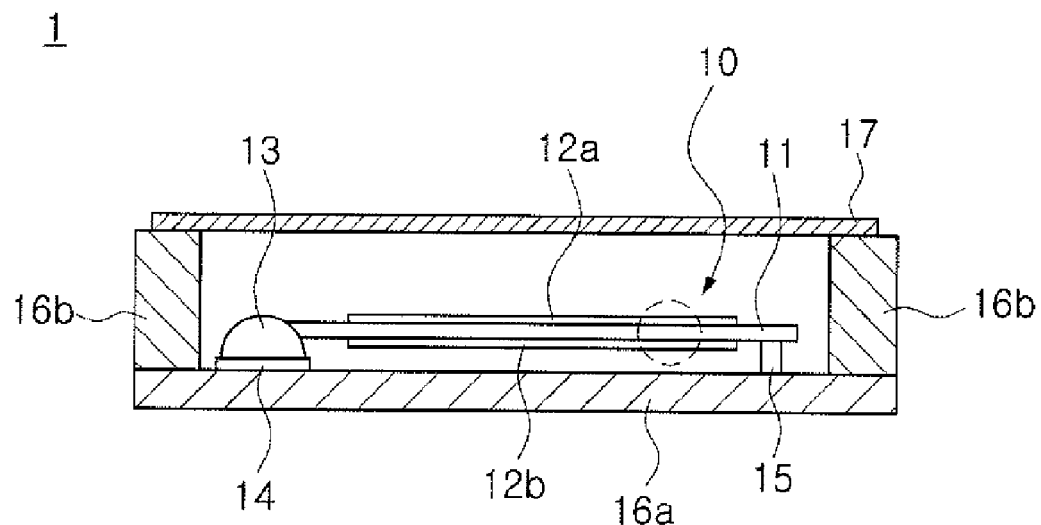
FIG. 1 is a schematic cross-sectional view of a piezoelectric resonator package according to an embodiment of the present invention.

Embodiments will be described in detail with reference to the accompanying drawings so that they can be easily practiced by those skilled in the art to which the present invention pertains. However, in describing embodiments of the present invention, detailed descriptions of well-known functions or constructions will be omitted so as not to obscure the description of the present invention with unnecessary detail.

In addition, like reference numerals denote parts performing similar functions and actions throughout the drawings.

In addition, unless explicitly described otherwise, "comprising" any components will be understood to imply the inclusion of other components but not the exclusion of any other components.

Hereinafter, a piezoelectric resonator and an electrode structure thereof according to an embodiment of the present invention will be described in detail with reference to FIGS. 1 through 4.

FIG. 1 shows a cross section of a piezoelectric resonator package 1 according to an embodiment of the present invention. Referring to FIG. 1, a piezoelectric resonator 10 includes a piezoelectric plate 11 including a quartz piece and first and second electrodes 12a and 12b formed on both surfaces of the piezoelectric plate 11. Particularly, the first and second electrodes 12a and 12b may be formed symmetrically on both surfaces of the piezoelectric plate 11. Therefore, the piezoelectric resonator 10 may have a package structure such as that shown in FIG. 1.

The piezoelectric resonator package 1 includes a bottom layer 16a, an electrode pad 14 formed on the bottom layer 16a, the piezoelectric plate 11 having one side of the piezoelectric resonator fixed to one side thereof by a conductive paste 13 formed on the electrode pad 14, and a bump 15 disposed between an upper surface of the bottom layer 16a and the other side of the piezoelectric plate 11.

In this case, the piezoelectric plate 11 may have the first and second electrodes 12a and 12b formed on upper and lower surfaces thereof, and the first and second electrodes 12a and 12b are electrically connected to the electrode pad 19. The bottom layer 16a may have support layers 16b formed at edges thereof, and the support layers 16b form a space receiving the piezoelectric plate 11 therein. In addition, the support layers 16b may have a lid 17 disposed thereon, and the lid 17 seals the space.

Figure 2:
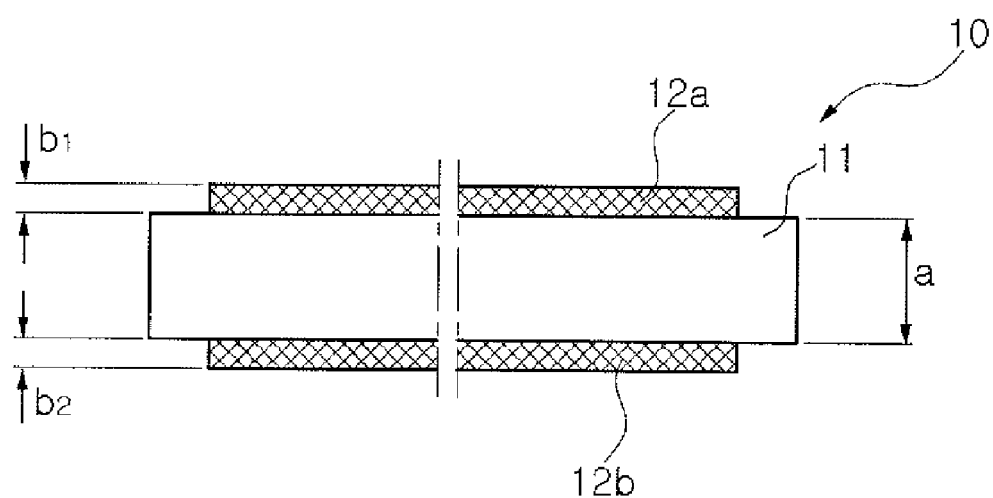
FIG. 2 is a partially enlarged view of FIG. 1, showing an electrode structure of a piezoelectric resonator of the piezoelectric resonator package according to an embodiment of the present invention.

FIG. 2 is an enlarged cross-sectional view of the piezoelectric resonator 10 of FIG. 1. The piezoelectric resonator 10 according to an embodiment of the present invention includes the piezoelectric plate 11 and the first and second electrodes 12a and 12b stacked on both surfaces of the piezoelectric plate 11.

The piezoelectric plate 11 generates a piezoelectric effect when an electrical signal is applied thereto. As a material of the piezoelectric plate 11, a quartz piece made of $SiO_2$ may be used; however, a material of the piezoelectric plate 11 is not limited thereto. In this case, the piezoelectric plate 11 may be formed by cutting and processing a quartz wafer.

The piezoelectric plate 11 has the first and second electrodes 12a and 12b stacked on both surfaces thereof. The first and second electrodes 12a and 12b provide the electrical signal to the piezoelectric plate 11 to thereby generate the piezoelectric effect in the piezoelectric plate 11 and serve to output the electrical signal by the piezoelectric effect of the piezoelectric plate 11.

The first and second electrodes 12a and 12b may be formed on both surfaces of the piezoelectric plate 11 by a process such as a deposition process to be described below.

An equivalent series resistance (ESR) value in the piezoelectric resonator is closely related to a resistance value of the electrode. The resistance value of the electrode may be represented by the following Equation:

$$R = \rho \frac{L}{A} = \rho \frac{L}{Wt}$$ Equation

In the Equation, p indicates a resistivity value of a resistor element, A indicates an area of the resistor element, and L indicates a length of the resistor element. The resistance value of the electrode is in proportion to the resistivity characteristics and the area of the resistor element and is in inverse proportion to the length of the resistor element.

With regard to the resistance value of the electrode of the piezoelectric resonator, $\rho$ indicates a specific resistivity value of an electrode material, W indicates a width of the electrode, and t indicates a thickness of the electrode. In addition, L indicates a length of the electrode.

Therefore, in order to manufacture a piezoelectric resonator having a low ESR value, a material having a low resistivity value $\rho$ may be selected, the length L of the electrode may be reduced, or the width W of the electrode may be increased.

In addition, when the thickness t of the electrode is increased, the ESR value may be reduced; however, a cost of a deposition process may be increased. When the thickness t of the electrode is increased, a cost of a process of etching the electrode in order to accurately adjust a frequency may be increased. In addition, the mechanical vibration characteristics of the piezoelectric plate may be deteriorated in accordance with the increase in the thickness t of the electrode.

Therefore, according to an embodiment of the present invention, a ratio of a thickness b1 of the first electrode 12a or a thickness b2 of the second electrode 12b to a thickness a of the piezoelectric plate 11 may be 1% or less.

In the case in which the ratio of the thickness b1 of the first electrode 12a or the thickness b2 of the second electrode 12b to the thickness a of the piezoelectric plate 11 exceeds 1%, ESR may be significantly increased and the mechanical vibration characteristics of the piezoelectric plate may be deteriorated.

Hereinafter, an electrode structure of the piezoelectric resonator will be described in detail.

Figure 3:
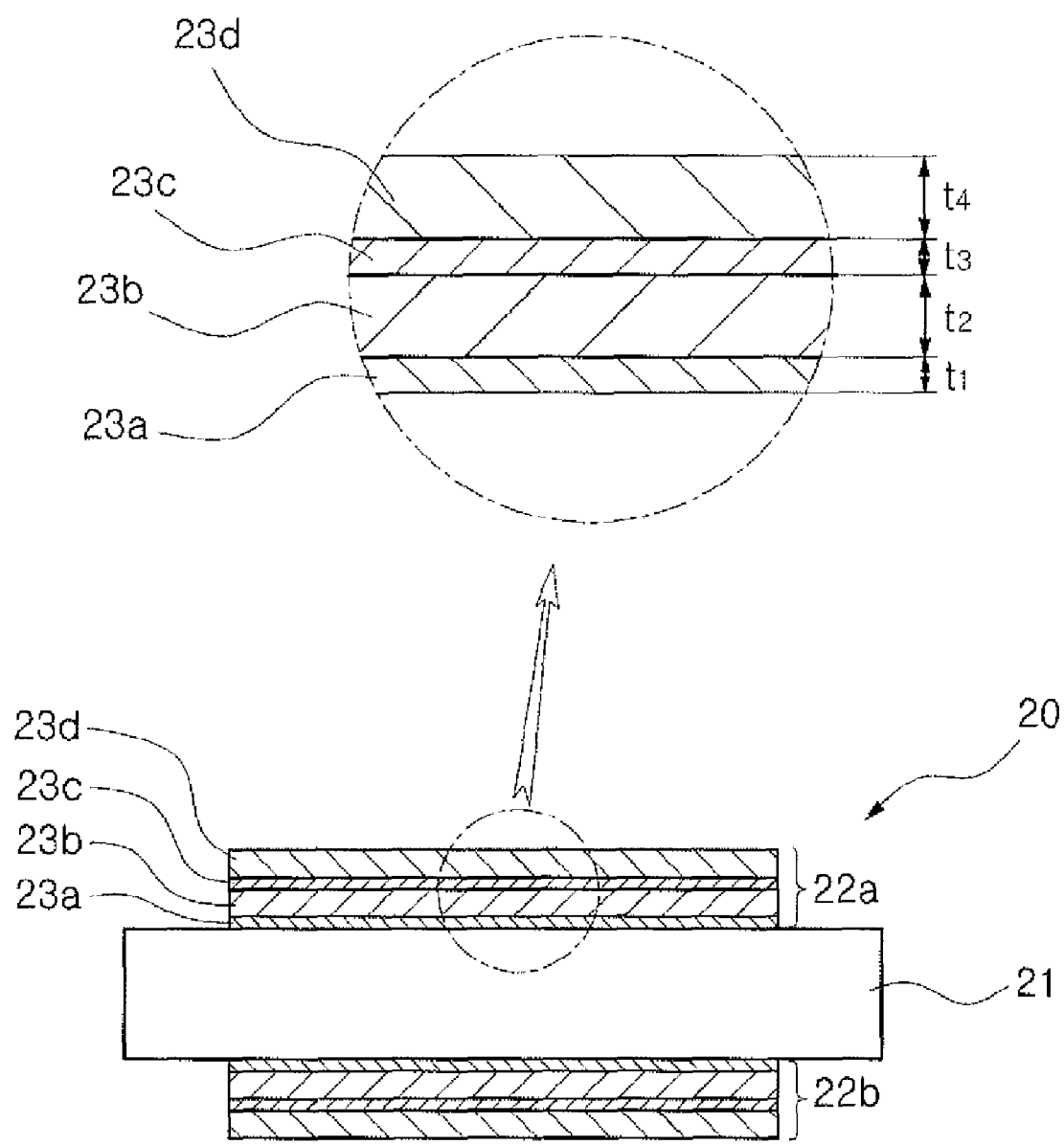
FIG. 3 is a schematic cross-sectional view more specifically showing an electrode structure of a piezoelectric resonator according to an embodiment of the present invention.

Referring to FIG. 3, an electrode structure of a piezoelectric resonator 20 according to an embodiment of the present invention includes a piezoelectric plate 21 vibrated by an electrical signal and first and second electrodes 22a and 22b stacked on both surfaces of the piezoelectric plate 21.

According to an embodiment of the present invention, since the first and second electrodes 22a and 22b are formed on both surfaces of the piezoelectric plate 21, a piezoelectric resonator having more accurate frequency characteristics may be provided.

The first and second electrodes 22a and 22b have a structure in which a first layer 23a, a second layer 23b, a third layer 23c, and a fourth layer 23d are stacked.

The first layer 23a serves to increase adhesion between the piezoelectric plate 21 and the first electrode 22a or the second electrode 22b and compensate for different coefficients of thermal expansion between individual layers.

According to an embodiment of the present invention, as a material of the first layer 23a, a material that is stable and has low electrical resistivity and excellent electrical conductivity may be used. As a material of the first layer 23a, at least one selected from the group consisting of Ti, Ni, Cr, an alloy including Ti and an alloy including Cr may be used; however, a material of the first layer 23a is not limited thereto.

According to an embodiment of the present invention, Cr may be used as a material of the first layer 23a in consideration of material cost reduction, a thermal expansion coefficient, and a bonding strength.

According to an embodiment of the present invention, the first layer 23a may have a thickness $t_1$ of 0.3 to 50 nm. In the case that the first layer has a thickness $t_1$ less than 0.3 nm, adhesion between the piezoelectric plate 11 and the first electrode or the second electrode may be reduced, and in the case that the first layer has a thickness $t_1$ more than 50 nm, the resistance of the piezoelectric resonator may be increased by 50% or more.

The second layer 23b may provide electrical conductivity and minimize a difference in coefficients of thermal expansion between the first electrode 22a or the second electrode 22b and the piezoelectric plate.

When there is a difference in coefficients of thermal expansion between the electrode material and the piezoelectric plate, stress between the piezoelectric plate and the electrode may be generated according to a change in a thermal environment in a process of manufacturing the piezoelectric resonator. Therefore, a phenomenon in which a frequency is varied after the piezoelectric resonator is manufactured may be generated.

According to an embodiment of the present invention, as a material of the second layer 23b, Ag or an alloy including Ag may be used. Since Ag or the alloy including Ag and the piezoelectric plate have a small difference in coefficients of thermal expansion therebetween, Ag or the alloy including Ag may prevent a frequency variation phenomenon due to thermal stress.

In addition, when the length and width of the electrode are adjusted in order to reduce the ESR value of the piezoelectric resonator, there may be a limitation according to the size of a product and the shape of the piezoelectric plate. Therefore, a metal having a low resistivity p is used as the electrode material, whereby the ESR value may be reduced.

Since Ag or the alloy including Ag corresponds to a metal having a low resistivity among metals, it may effectively reduce the ESR of the piezoelectric resonator.

According to an embodiment of the present invention, the second layer 23b may have a thickness $t_2$ of 10 to 300 nm. When the second layer 23b has a thickness $t_2$ of less than 10 nm, a phenomenon in which materials are diffused between the first and second layers 23a and 23b may be generated and a phenomenon in which a frequency variation width is increased to about 100 ppm over time, due to the diffusion of the materials between the first and second layers may be generated. In addition, when the second layer 23b has a thickness $t_2$ of more than 300 nm, the resistance value of the piezoelectric resonator may be increased by 50% or more. Therefore, the second layer 23b may have the thickness $t_2$ of 10 to 300 nm.

The third layer 23c is formed between the fourth layer 23d and the second layer 23b and serves to increase adhesion between conductive materials. That is, the third layer 23c serves to increase adhesion between the electrode and the piezoelectric plate.

In addition, when the second layer 23b is relatively thick, impedance is increased and a difference in coefficients of thermal expansion between the second layer and the piezoelectric plate is increased, such that a frequency variation width may be increased due to the thermal stress. Therefore, the thickness of the second layer 23b is reduced and the third layer 23c is formed, whereby the difference in coefficients of thermal expansion between the second layer 23b and the piezoelectric plate 11 may be minimized.

According to an embodiment of the present invention, as a material of the third layer 23c, a material having low electrical resistivity and excellent electrical conductivity and providing adhesion between conductive materials may be used. As a material of the third layer 23c, at least one selected from the group consisting of Ti, Ni, Cr, an alloy including Ti and an alloy including Cr may be used; however, a material of the third layer 23c is not limited thereto.

A material of the first layer 23a may be the same as that of the third layer 23c. In this case, the thickness of the second layer 23b may be thinned and a difference in coefficients of thermal expansion between the second layer 23b and the fourth layer 23d may be compensated for, whereby frequency variations due to the thermal stress generated at the time of a reflow process may be prevented.

According to an embodiment of the present invention, the third layer 23c may have a thickness $t_3$ of 0.3 to 50 nm. In the case that the third layer 23c has a thickness of less than 0.3 nm, a frequency variation width exceeds 5 ppm after the reflow process, and when the third layer 23c has a thickness of more than 50 nm, impedance of the electrode may be increased by 50% or more.

The fourth layer 23d, which is an outermost layer of the electrode structure, serves to provide electrical conductivity and compensate for a difference in coefficients of thermal expansion between the first and third layer 23a and 23c and the piezoelectric plate 11, similar to the second layer 23b.

In addition, the fourth layer 23d, which is the outermost layer, serves to protect the first to third layers 23a to 23c formed inwardly thereof. A portion of the fourth layer 23d may be etched using Ar, or the like, in order to adjust the frequency after the piezoelectric resonator is manufactured.

Therefore, as a material of the fourth layer 23d, a material having excellent oxidization resistance and capable of easily performing frequency adjustment may be used. According to an embodiment of the present invention, as a material of the fourth layer 23d, Ag or an alloy including Ag may be used; however, a material of the fourth layer 23d is not limited thereto.

Particularly, in the case of using Ag or the alloy including Ag as the material of the fourth layer 23d, a frequency variation width may be reduced. In the case of using Au as the material of the fourth layer 23d, excellent oxidization resistance is provided; however, manufacturing costs may be increased. In addition, Au has a coefficient of thermal expansion of $14.2 \times 10^{-6}$ mm/° C. and the piezoelectric plate has a coefficient of thermal expansion of $13.7 \times 10^{-6}$ mm/° C.

Since Au has a coefficient of thermal expansion similar to that of the piezoelectric plate, in the case of using a metal such as Cr having a coefficient of thermal expansion of ($8.4 \times 10^{-6}$ mm/° C.), lower than that of the piezoelectric plate, as the material of the first and third layers, a difference in coefficients of thermal expansion between the metal and the piezoelectric plate may not be sufficiently compensated for. Therefore, in the case of using Au as the material of the fourth layer, a frequency variation rate may be increased.

However, in the case of using Ag as the material of the fourth layer, manufacturing costs may be reduced. In addition, since Ag has a coefficient of thermal expansion of $18.9 \times 10^{-6}$ mm/° C., in the case of using a metal such as Cr as the material of the first and third layers, an Ag layer may appropriately compensate, for a difference in coefficients of thermal expansion between the Ag layer and the first and third layers. Therefore, a frequency variation width of the piezoelectric resonator may be significantly reduced directly after the piezoelectric resonator is manufactured.

More specifically, in the case of using Au as the material of the fourth layer, a frequency variation width of the piezoelectric resonator over time is about 10 ppm. However, in the case of using Ag as the material of the fourth layer, a frequency variation width of the piezoelectric resonator over time may be reduced to 5 ppm or less. Therefore, in the case of using Ag as the material of the fourth layer 23d, a more accurate piezoelectric resonator may be manufactured.

The fourth layer 23d may have a thickness of 3 nm or more. In the case that the fourth layer 23d has a thickness less than 3 nm, a phenomenon in which the third layer 23c is exposed or is even etched may be generated in an etching process for frequency adjustment.

In addition, in the case that the fourth layer 23d has a thickness less than 3 nm, the difference in coefficients of thermal expansion may not sufficiently compensated for, such that the frequency variation width may be increased to 5 ppm or more after the reflow process and increased over time due to the diffusion of the material between the third and fourth layers.

When the fourth layer 23d has a thickness $t_4$ of 3 nm or more, the frequency variation width may be 3 ppm or less after the reflow process and may be maintained in 5 ppm or less after 1,000 hours have passed.

Figure 4:
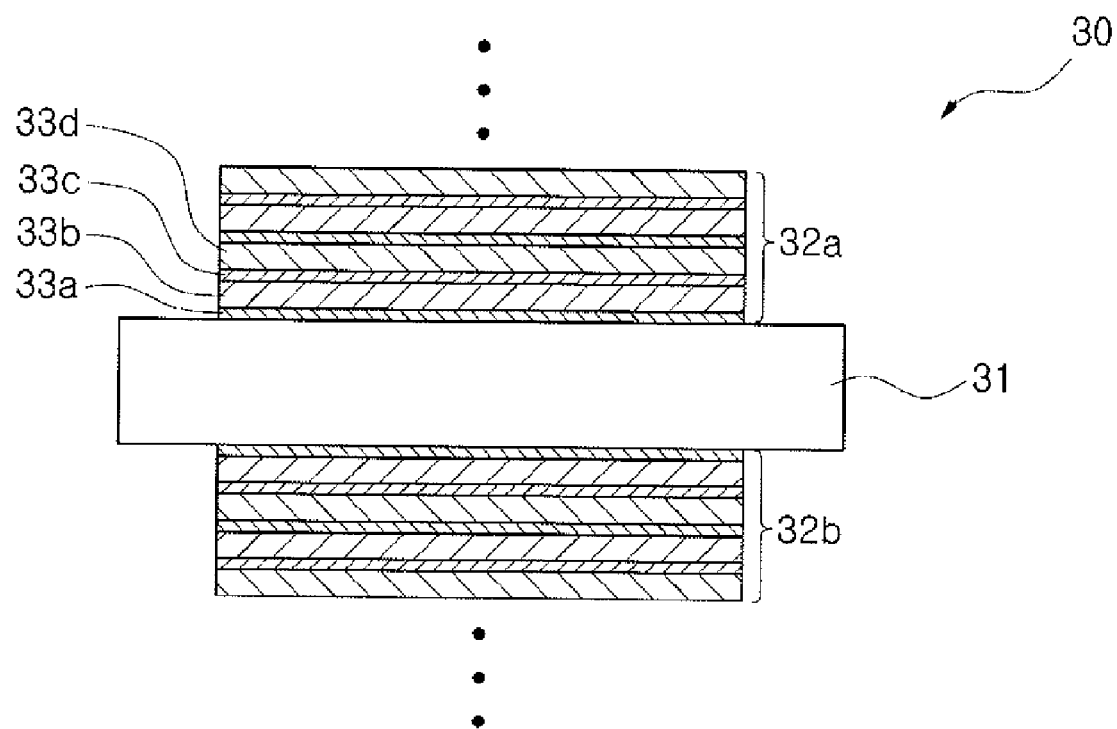
FIG. 4 is a schematic cross-sectional view showing an electrode structure of a piezoelectric resonator according to another embodiment of the present invention.

Referring to FIG. 4, a piezoelectric resonator 30 according to another embodiment of the present invention includes first and second electrodes 32a and 32b formed by repeatedly stacking first to fourth layers 33a to 33d on a piezoelectric plate 31 two or more times.

When the first to fourth layers 33a to 33d are repeatedly stacked two or more times, adhesion between the piezoelectric plate 31 and the first and second electrodes 32a and 32b may be increased. In addition, a difference in coefficients of thermal expansion between different electrode materials may be compensated for, such that the frequency variation width after the process of manufacturing the piezoelectric resonator may be further reduced.

According to embodiments of the present invention, a piezoelectric resonator having a stable electrode structure may be provided. A piezoelectric resonator having low ESR, a low frequency variation width, and high reliability may be manufactured.

Particularly, a piezoelectric resonator having a low frequency variation width even after a process during which thermal stress is applied, such as a reflow process, may be provided. Therefore, a piezoelectric resonator capable of being used in a desired product directly after being manufactured may be manufactured.

In addition, a piezoelectric resonator capable of maintaining a constant frequency over the passage of time after being manufactured may be used in a product requiring frequency accuracy.

COMPARATIVE EXAMPLE

In the case of a Comparative Example, first and second electrodes having first to fourth layers stacked on each of upper and lower surfaces of a piezoelectric plate were used. Particularly, a Ni—Cr alloy was used as a material of the first and third layers, Ag was used as a material of the second layer, and Au was used as a material of the fourth layer.

INVENTIVE EXAMPLE

In a piezoelectric resonator according to an Inventive Example, first and second electrodes having first to fourth layers stacked on both surfaces of a piezoelectric plate were used. Particularly, Cr was used as a material of the first and third layers, and Ag was used as a material of the second layer and the fourth layer.

The piezoelectric plate was manufactured to have a thickness of 41 μm, and the first and second electrodes were formed such that the sum of thicknesses of the first to fourth layers was 350 nm.

Figure 5A:
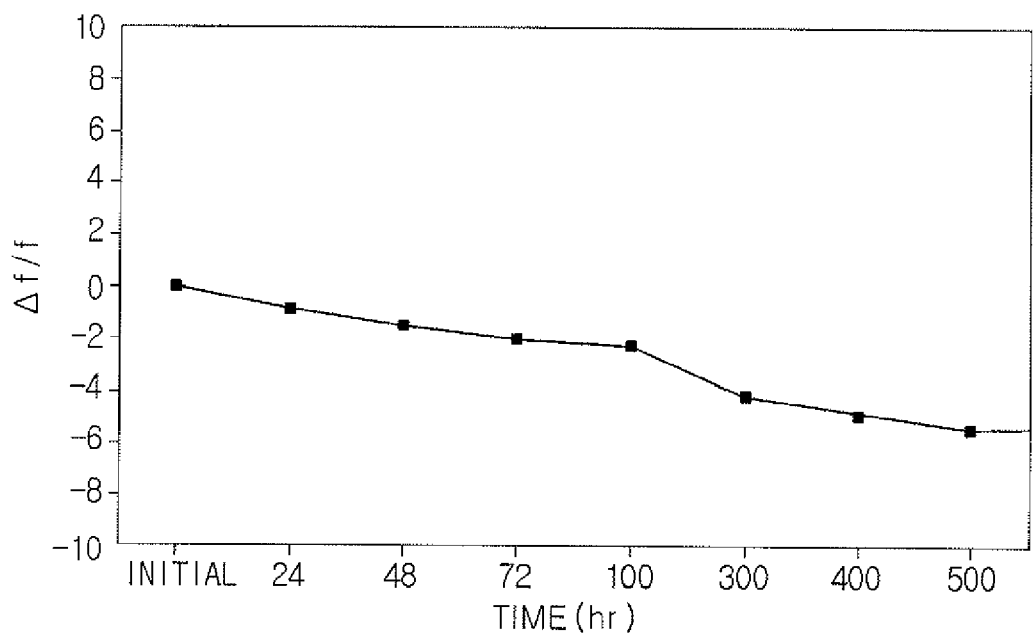
FIGS. 5A and 5B are graphs comparing reflow characteristics of a piezoelectric resonator using an electrode structure according to Comparative Example and reflow characteristics of a piezoelectric resonator using an electrode structure according to Inventive Example over time.
Figure 5B:
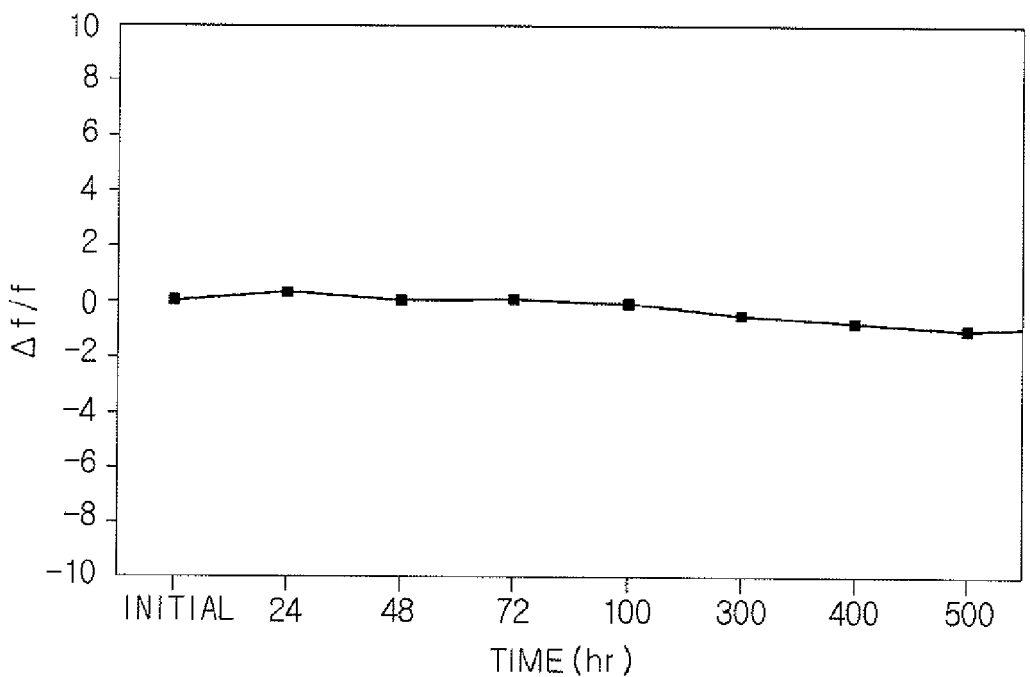

FIGS. 5A and 5B are graphs comparing a rate of variations in frequency characteristics over time with respect to an acceleration test (at a temperature of 125° C.) of a piezoelectric resonator using an electrode structure manufactured according to the Comparative Example, and a rate of variations in frequency characteristics over time with respect to an acceleration test (at a temperature of 125° C.) of a piezoelectric resonator using an electrode structure manufactured according to the Inventive Example.

More specifically, FIG. 5A is a graph of frequency characteristics over time with respect to an acceleration test (at a temperature of 125° C.) of a piezoelectric resonator according to the Comparative Example; and FIG. 5B is a graph of frequency characteristics over time with respect to an acceleration test (at a temperature of 125° C.) of a piezoelectric resonator according to the Inventive Example.

Referring to FIG. 5A, it may be appreciated that in the case of the electrode according to the Comparative Example, a frequency variation rate after the acceleration test was about 6 ppm and a frequency was stable after 500 hours had passed.

Referring to FIG. 5B, it may be appreciated that in the case of the Inventive Example, a frequency variation rate over time was less than 2 ppm. It may be appreciated that a frequency of the piezoelectric resonator is stably maintained as a value almost similar to an initial value after the acceleration test.

As set forth above, according to embodiments of the present invention, a piezoelectric resonator having a stable electrode structure may be provided. A piezoelectric resonator having low ESR, a low frequency variation width, and high reliability may be manufactured.

Particularly, a piezoelectric resonator having a low frequency variation width even after a process during which thermal stress is applied, such as a reflow process, may be provided. In addition, a piezoelectric resonator capable of maintaining a constant frequency over the passage of time after being manufactured may be provided.

While the present invention has been shown and described in connection with the exemplary embodiments, it will be apparent to those skilled in the art that modifications and variations can be made thereto without departing from the spirit and scope of the invention as defined by the appended claims.

What is claimed is:

1. A piezoelectric resonator, comprising:
   a piezoelectric plate configured to vibrate in response to an electrical signal; and
   first and second electrodes having first to fourth layers stacked on respective surfaces of the piezoelectric plate, wherein
   the first and third layers are made of at least one selected from the group consisting of Ti, Ni, Cr, an alloy including Ti, and an alloy including Cr,
   the second and fourth layers are made of Ag or an alloy including Ag, and
   the first layer has a thickness of 0.3 nm to 50 nm.

2. The piezoelectric resonator of claim 1, wherein a ratio of a thickness of the first electrode or the second electrode to a thickness of the piezoelectric plate is 1% or less.

3. The piezoelectric resonator of claim 1, wherein the second layer has a thickness of 10 nm to 300 nm.

4. The piezoelectric resonator of claim 1, wherein the third layer has a thickness of 0.3 nm to 50 nm.

5. The piezoelectric resonator of claim 1, wherein the fourth layer has a thickness of 3 nm or more.

6. The piezoelectric resonator of claim 1, wherein the first and second electrodes have a structure in which the first to fourth layers are repeatedly stacked on the respective surfaces of the piezoelectric plate.

7. An electrode structure of a piezoelectric resonator, the electrode structure comprising first to fourth layers stacked on a main surface of a piezoelectric plate, wherein
the first and third layers are made of at least one selected from the group consisting of Ti, Ni, Cr, an alloy including Ti, and an alloy including Cr,
the second and fourth layers are made of Ag or an alloy including Ag, and
the first layer has a thickness of 0.3 nm to 50 nm.

8. The electrode structure of claim 7, wherein a ratio of a thickness of an electrode to a thickness of the piezoelectric plate is 1% or less.

9. The electrode structure of claim 7, wherein the first to fourth layers are repeatedly stacked on the main surface of the piezoelectric plate.

10. The electrode structure of claim 7, wherein the second layer has a thickness of 10 nm to 300 nm.

11. The electrode structure of claim 7, wherein the third layer has a thickness of 0.3 nm to 50 nm.

12. The electrode structure of claim 7, wherein the fourth layer has a thickness of 3 nm or more.

* * * * *